US005573959A

United States Patent [19]
Kodaira et al.

[11] Patent Number: 5,573,959
[45] Date of Patent: Nov. 12, 1996

[54] METHOD OF FORMING A LIQUID CRYSTAL DEVICE

[75] Inventors: Toshimoto Kodaira; Hiroyuki Oshima; Toshihiko Mano, all of Suwa, Japan

[73] Assignee: Seiko Epson Corporation, Tokyo, Japan

[21] Appl. No.: 445,030

[22] Filed: May 19, 1995

Related U.S. Application Data

[63] Continuation of Ser. No. 237,521, May 3, 1994, Pat. No. 5,474,942, which is a continuation of Ser. No. 14,053, Feb. 5, 1993, Pat. No. 5,365,079, which is a continuation of Ser. No. 803,699, Dec. 4, 1991, abandoned, which is a continuation of Ser. No. 484,466, Feb. 22, 1990, abandoned, which is a continuation of Ser. No. 285,292, Dec. 15, 1988, abandoned, which is a continuation of Ser. No. 894,432, Jul. 16, 1986, abandoned, which is a continuation of Ser. No. 489,986, Apr. 29, 1983, abandoned.

[30] Foreign Application Priority Data

Apr. 30, 1982 [JP] Japan .................. 57-074014
Apr. 30, 1982 [JP] Japan .................. 57-074015
May 6, 1982 [JP] Japan .................. 57-075814

[51] Int. Cl.$^6$ ........................................ H01L 21/84
[52] U.S. Cl. .................. 437/21; 437/48; 437/42; 437/51
[58] Field of Search .............................. 437/21, 40 TFI, 437/41 TFI, 46, 47, 48, 50, 51, 42; 257/59, 71, 72; 359/59

[56] References Cited

U.S. PATENT DOCUMENTS

| | | |
|---|---|---|
| 3,840,695 | 10/1974 | Fischer . |
| 4,024,562 | 5/1977 | Brown et al. . |
| 4,239,346 | 12/1980 | Lloyd . |
| 4,291,322 | 9/1981 | Clemens et al. . |
| 4,332,075 | 6/1982 | Ota et al. . |
| 4,336,295 | 6/1982 | Smith . |
| 4,385,292 | 5/1983 | Nonomura et al. . |
| 4,404,578 | 9/1983 | Takafuji et al. . |
| 4,431,271 | 2/1984 | Okubo . |
| 4,455,568 | 6/1984 | Shiota . |
| 4,543,573 | 9/1985 | Fuyama et al. . |
| 4,582,395 | 4/1986 | Morozumi . |
| 5,218,464 | 6/1993 | Hiroki et al. . |

FOREIGN PATENT DOCUMENTS

| | | |
|---|---|---|
| 54-20692 | 2/1979 | Japan . |
| 58-125087 | 7/1983 | Japan . |
| 2067353 | 12/1980 | United Kingdom . |
| 2066545 | 7/1981 | United Kingdom . |

OTHER PUBLICATIONS

Hayama et al., "Amorphous–silicon thin–film metal–oexide–semiconductor transistors", *App. Phys. Lett.* 36(9), May 1, 1980, pp. 754–755.

Hosokawa et al, "Dichroic Guest–Host Active Matrix Video Display", *Biennial Display Research Conference*, Paper 11.6 (1980).

Kamins et al., "Hydrogenation of Transistors Fabricated in Polycrystalline–Silicone Films", *IEEE Elec. Dev. Lett.*, vol. EDL–1, No. 8, Aug. 1980, pp. 159–161.

Morozumi, "Active Matrix Addressed Liquid–Crystal Displays", *1985 International Display Research Conference*, pp. 9–13.

*Primary Examiner*—Mary Wilczewski
*Attorney, Agent, or Firm*—Oliff & Berridge

[57] ABSTRACT

Improved thin film transistors resistant to photo-induced current and having improved electrical contact between electrodes and the source or drain regions are provided. The thin film transistors formed in accordance with the invention are particularly well suited for use in an active matrix substrate for a liquid crystal display panel. The liquid crystal display panels include an additional insulating layer formed between crossing orthogonal source lines and gate lines to provide a higher breakdown voltage between the source lines and gate lines than at the gate insulating layer of the thin film transistors.

6 Claims, 6 Drawing Sheets

FIG.12b

METHOD OF FORMING A LIQUID CRYSTAL DEVICE

This is a continuation of application Ser. No. 08/237,521 filed May 3, 1994 now U.S. Pat. No. 5,474,942, which in turn is a continuation of Ser. No. 08/014,053 filed Feb. 5, 1993, now U.S. Pat. No. 5,365,079 which in turn is a Continuation of Ser. No. 07/803,699 filed Dec. 4, 1991 (abandoned), which is a Continuation of Ser. No. 07/484,466 filed Feb. 22, 1990 (abandoned), which is a Continuation of Ser. No. 07/285,292 filed Dec. 15, 1988 (abandoned), which is a Continuation of Ser. No. 06/894,432 filed Jul. 16, 1986 (abandoned), which is a Continuation of Ser. No. 06/489,986 filed Apr. 29, 1983 (abandoned).

BACKGROUND OF THE INVENTION

This invention relates to thin film transistors, and more particularly to semiconductor thin film transistors having reduced photo-induced current, improved electrical contact between a transparent electrode and the source or drain region of the transistor, and reduced shorting between a source line and a gate line in a matrix array, resulting in improved liquid crystal display devices including the transistors.

The formation of a thin film transistor (hereinafter referred to as TFT) on an insulating layer has applications to many fields. TFTs can be used in thin active matrix display panels formed on inexpensive insulating substrates, three-dimensional integrated circuits having an active element such as a transistor formed on a semiconductor integrated circuit, inexpensive, high-performance image sensors, high-density memory devices, and the like.

Thin active matrix displays utilizing TFTs include an upper transparent substrate, a lower transparent substrate on which the TFTs are formed and a liquid crystal material sealed between the substrates. Liquid crystal driving electrodes are arranged in the matrix of TFTs. An external selecting circuit selects some of the liquid crystal driving elements and each associated liquid crystal driving electrode is excited to display the desired letters, figures or pictures. When the TFTs are formed on an inexpensive insulating substrate and a transparent electrode of a material, such as indium oxide, tin oxide, indium-tin oxide, or the like is used as the display driving electrode, a transparent-type display panel is obtained.

Large-scale liquid crystal display devices utilizing picture elements arranged in an active matrix are currently attracting much attention. They are now being used in a variety of applications, such as small-size personal computers, hand-held televisions and the like. In such display devices using picture element arranged in the matrix array, the use of switching elements for, in particular, planar, large scale display devices is currently being developed. When a TFT is used in an active matrix panel, each TFT controls application of the voltage of the data signals to the liquid crystal material. In order to obtain superior display performance, the TFT must have the following characteristics.

(1) When the TFT is in the ON condition it must supply sufficient current to charge the capacitor. Improved display performance depends on the potential of the capacitor, which must be stored in a short period of time.

(2) When the TFT is in the OFF condition, it exhibits low current leakage. This is necessary as the charge in the capacitor must be held for a longer period of time than the writing period.

When a TFT is irradiated with light, carrier density in the accumulation region is increased, due to the light. The depletion layer at the PN junction is narrowed by the increased carrier density. As a result, both ON current and OFF current are increased. The increase in OFF current is significant. In fact, the increment of leakage current caused by irradiating light is proportional to the illuminance of light. Thus, the brighter the environment is made, the more OFF current increases. While the contrast and display characteristics of a liquid crystal display device generally improves in bright light, the same light simultaneously deteriorates the TFT display performance, due to the increase in OFF current caused by light. Therefore, the TFT have this disadvantage when used in a liquid crystal display device as a switching element.

A TFT in a matrix display device has a three layer electrode construction for connecting a drain electrode and a driving electrode. This conventional construction is not fully satisfactory as the metallic layer connecting the drain and electrode can form an insulating oxide such as for example aluminum oxide when an aluminum layer is used to couple the drain and the driving electrode. As a result, unwanted variations in display contrast are caused by the insulating effect of the oxide on the contact portions, thereby adversely affecting the display characteristics.

After the matrix array is completed, a breakdown of insulation between lines tends to occur due to static electricity or the like. When static electricity is applied to a source line or gate line outside of the display area, poor insulation results at the intersection of orthogonally crossing lines. As a result of this poor insulation, a data signal leaks into a gate line or a timing signal leaks into a source line. This leak occurs at the intersection of the gate line and source line, which is the so-called line fault. As a result, the display by every picture element connected to the line fault is affected adversely and the display characteristics of the matrix array deteriorate substantially.

The most general method for compensating for deteriorated insulation is cutting off the source line or the gate line around the poor insulating portion. In this method, however, a line fault inevitably occurs as the elements connected to the broken source line or the broken gate line are in a non-lighting condition. In the case where a matrix array is formed on a single crystalline silicon substrate, static electricity can be avoided by providing a diode or other resistance in the silicon substrate. On the other hand, in the case where a matrix array including thin film transistors is formed on a glass substrate, poor insulation is likely to occur, because it is very difficult to provide a circuit fur warding off the invasion of static electricity. As a result, the production yield of the matrix array is remarkably unsatisfactory due to poor insulation. Accordingly, there exists a need for improved thin matrix arrays and display devices, including the active matrix arrays which have reduced photo-induced current, improved electrode contact particularly in the case of transparent driving electrodes coupled to the drain by a metal which forms an insulating oxide film, and have improved insulation between the source line and gate line or the driving electrode, particularly in the case of TFT arrays formed on an insulating substrate.

SUMMARY OF THE INVENTION

Thin film display matrices of the invention include thin film transistors formed on an insulating substrate, a plurality of picture elements arranged in a matrix, wherein the picture elements are composed of driving electrodes for a liquid crystal, a capacitor for storing data signals, a plurality of gate lines and a plurality of source lines orthogonally arranged and connected to a gate and a source of the transistor. The thin film transistor applies the data signal to the capacitor and the driving electrode. One of the drain or gate electrodes of the transistor is patterned to cover the channel region of the transistor to reduce the generation of photo-induced current.

The picture element driving electrode in a transparent display device is a transparent electrode which is brought into direct contact with either the source region or the drain region of the transistor. Direct contact between the drain region and the transparent electrode provides more stable display characteristics. An additional insulating layer is disposed between overlying, intersecting, orthogonal source lines and gate lines. The breakdown voltage at the intersection is greater than the breakdown voltage of the gate insulating layer of the thin film transistor. Accordingly, static electricity induced line faults, and accompanying disruption of matrix pattern, are substantially reduced.

Accordingly, an object of the invention is to provide an improved thin film transistor.

Another object of the invention is to provide an improved thin film transistor formed on an insulating substrate.

A further object of the invention is to provide an improved active matrix array utilizing the thin film transistors as switching elements.

Still another object of the invention is to provide an active matrix array utilizing thin film transistors with improved electrical contact between the transistor drain regions and the driving electrodes.

Still a further object of the invention is to provide a thin film transistor having reduced photo-induced current.

Yet another object of the invention is to provide a thin film transistor having reduced current leakage when in the OFF condition.

Yet a further object of the invention is to provide an improved liquid crystal display device having picture elements arranged in a matrix utilizing thin film transistors formed on an insulating substrate as switching elements.

A further object of the invention is an improved liquid crystal display device having improved contact between the drain regions of the TFTs and the driving electrodes.

Another object of the invention is to provide improved liquid crystal display device including an active matrix array formed on an insulating substrate having improved insulation between intersecting elements of the array.

A further object of the invention is to provide a process for forming an active matrix array utilizing thin film transistors as switching elements with improved electrical contact between the drain regions and the driving electrodes.

Yet another object of the invention is to provide a process for forming a liquid crystal display device including an active matrix array.

Still other objects and advantages of the invention will in part be obvious and will in part be apparent from the specification.

The invention accordingly comprises an article of manufacture possessing the features, properties, and the relation of elements which will be exemplified in the article hereinafter described, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1b is a circuit diagram of a display element of the array of FIG. 1a;

FIG. 10a is a plan view of a display element utilized in a matrix array of the type illustrated in FIG. 1a;

FIG. 10b is a sectional view along line 10b of FIG. 10a;

FIG. 11b is a plan view showing the intersection between the gate line and source line of FIG. 11a;

FIG. 12a is a plan view of an alternate embodiment of a display element corresponding to FIG. 10a; and FIG. 12b is a sectional view along line 12b of FIG. 12a.

DESCRIPTION OF THE PREFERRED EMBODIMENTS

In general, an active matrix display panel which utilizes a TFT as a switching element includes an upper transparent substrate, a lower transparent substrate on which TFTs are formed and a liquid crystal material is sealed between the substrates. Liquid crystal driving elements associated with corresponding liquid crystal driving electrodes are arranged in the matrix on the TFT array. An external selecting circuit selects some of the liquid crystal driving elements and each associated liquid crystal driving electrode is excited to display desired letters, figures or pictures.

Figure 1A:
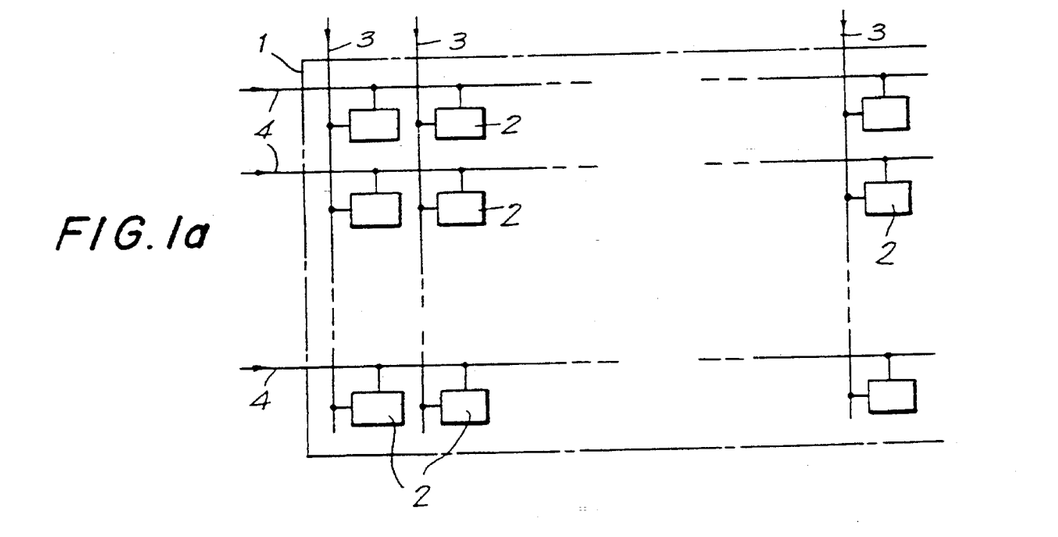
FIG. 1a is a plan view of liquid crystal display elements including thin film transistors in an active matrix display panel.
Figure 1B:
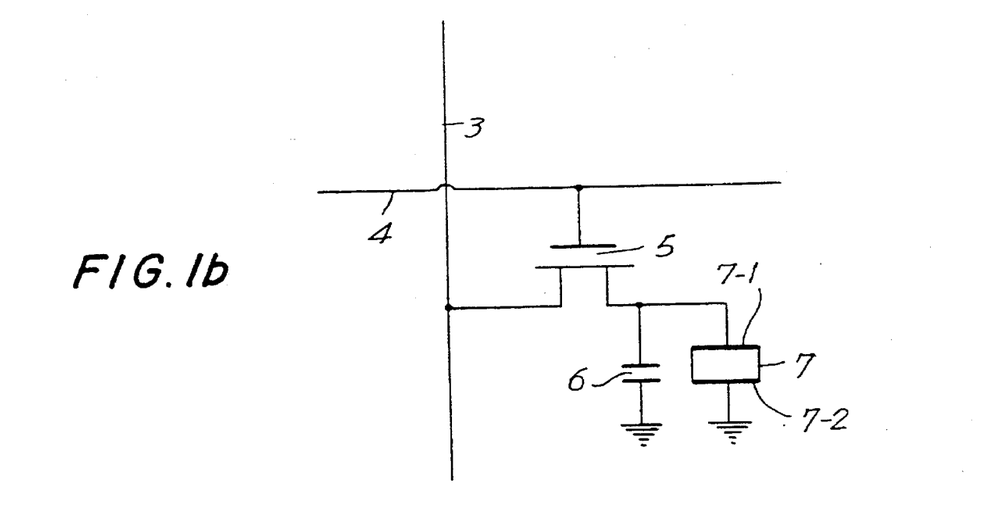

FIGS. 1a and b illustrates in general liquid crystal display elements utilizing TFTs as switching elements in an active matrix display panel. FIG. 1a shows the matrix-type arrangement of liquid crystal driving elements formed on a lower substrate on which the TFTs are formed. A display region is surrounded by a boundary line 1 wherein a plurality of liquid crystal driving elements 2 are arranged in matrix format. A data signal line 3 and a timing signal line 4 are connected to each liquid crystal driving element 2.

FIG. 1b represents a detailed construction of each liquid crystal driving element 2. A liquid crystal cell 7 includes a liquid crystal driving electrode 7-1 corresponding to each liquid crystal driving element and has an opposed electrode 7-2 formed on an upper substrate. A TFT 5 controls the input of a data signal to liquid crystal cell 7. A capacitor 6 is used for storing the data signals and it is not required if the capacitance of the liquid crystal material is large enough.

When a TFT is used as a switching element in an active matrix panel, it selects the data signal to be applied to the liquid crystal material. The TFT controls the application of data signal voltage to the liquid crystal. In order to obtain high display performance, a TFT is required to have the following characteristics:

(1) When the TFT is ON, it permits enough current to flow to charge the associated a capacitor; and (2) When the TFT is OFF, it exhibits insignificant current leakage.

Requirement (1) is a necessary characteristic of a TFT with respect to the writing data applied to capacitor 6. The quality of liquid crystal display performance depends in part upon the potential across capacitor 6. The charge also has to be rapidly stored in capacitor 6. Thus, the TFT should be able to supply enough current to completely input the data signal into capacitor 6 in a very short time. The amount of current for data writing (hereinafter referred to as ON current) is determined in compliance with the capacitance of the capacitor and the time necessary for writing the data. Accordingly, a TFT should be formed so as to supply enough ON current in accordance with the characteristics of the capacitor. The amount of ON current flowing from a TFT depends on many factors, such as, e.g. the structure, manufacturing process and size of the TFT (channel length and/or channel width), the voltage applied to the gate or drain, etc.

Requirement (2) is a necessary characteristic of a TFT relating to holding written data in a capacitor for a long time. In general, data written into a capacitor should be maintained there for a longer period of time than that of the writing of that data. The capacitance of a capacitor is usually as small as approximately 1 pF. Therefore, the amount of charge stored in the capacitor is small and is easily affected by a small amount of leakage current flowing between source and drain. In other words, if a leakage current occurs when a TFT is OFF (hereinafter referred to as OFF current), the potential at a drain where a capacitor is coupled to a TFT becomes close to the potential at the source. As a result, data written into the capacitor is not retained and the voltage drops to the voltage level of the data signal line. As a result, the signal in the capacitor cannot be properly retained in the capacitor, and image sharpness is lost. Thus, it is a significant object of the invention to reduce OFF current between the source and drain of the TFTs in the array.

When a TFT is irradiated with light, the carrier density in the accumulation region is increased, due to the light. The depletion layer at the PN junction is narrowed by the increased carrier density. As a result, both ON current and OFF current are increased. The rate of increase of OFF current is surprisingly large. In fact, as the rate of increase in leakage current is in proportion to the illuminance of the light, the brighter that the environment is made the greater the increase in OFF current. Therefore, it is disadvantageous to use a TFT in a liquid crystal display device as a switching element. While a liquid crystal display device generally takes advantage of bright light for improved contrast and superior display-characteristic, the same light simultaneously deteriorates the performance of the TFT, due to the OFF current caused by light.

Figure 2:
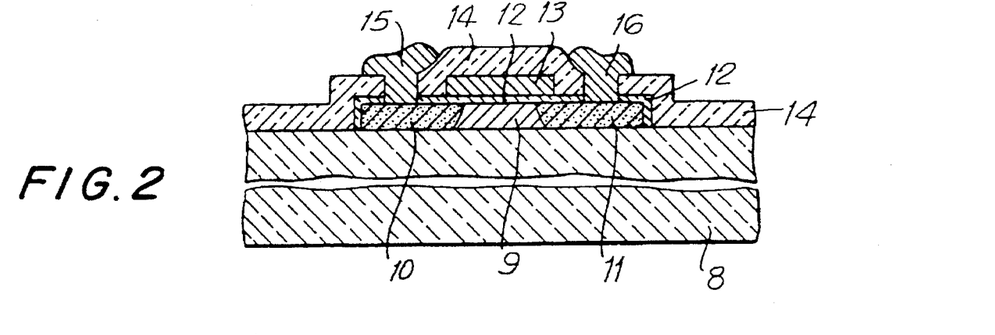
FIG. 2 is a sectional view of a thin film transistor formed on an insulating substrate.

FIG. 2 is a cross-sectional view illustrating the general structure of a conventional N-channel TFT formed on an insulating transparent substrate 8, such as glass or quartz. A semiconductor thin film 9, such as polycrystalline silicon, is formed on substrate 8. A gate insulating film 12 is formed on thin film 9. A source region 10 is formed by doping impurities such as phosphorous, arsenic, or the like, into thin film 9. A drain region 11 is formed in the same manner as source region 10. A gate electrode 13 is formed on film 12. An insulating layer 14 is disposed on gate 13 and film 12, except where a source electrode 15 and a drain electrode 16 are formed through insulating layer 14.

Figure 3:
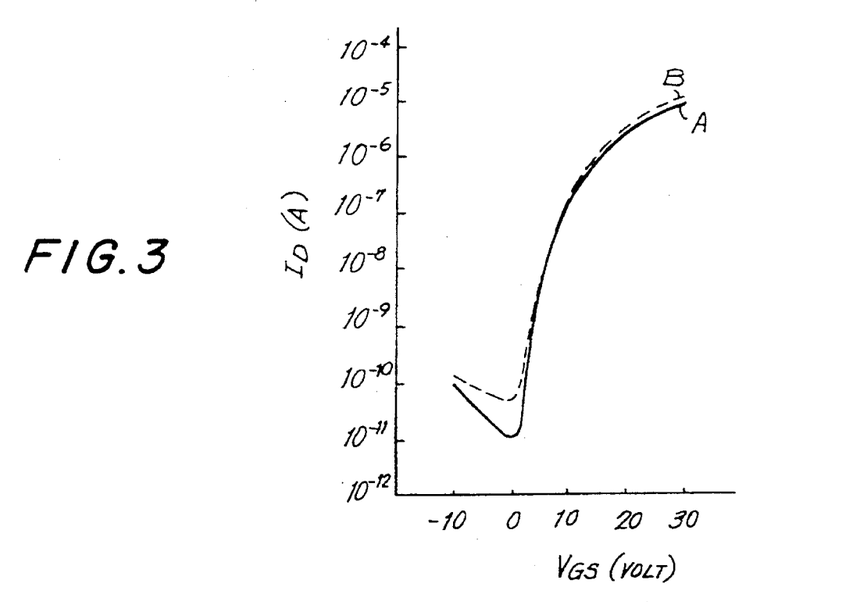
FIG. 3 is a graph illustrating the drain current and gate voltage of a transistor of FIG. 2 under a light and non-light condition.

FIG. 3 is a graph illustrating characteristics of a TFT of the construction of FIG. 2 and is based on experimental values. The abscissa represents the gate voltage to the source ($V_{GS}$) and the ordinate represents the drain current $I_{DS}$. Drain voltage to source ($V_{DS}$) is constant, at 4 V. A solid line "A" shows drain current when there is no illumination (dark current) and a broken line "B" shows drain current under illumination of 10,000 luxes. As seen from FIG. 3, the ON current increases slightly when the TFT is irradiated, but the OFF current increases significantly. As a result, the margin of the ON current to the OFF current ratio becomes too narrow to provide the superior-characteristics required of a transistor in a matrix display.

In view of this it is a significant object of this invention to provide an improved structure for a TFT wherein the photo-induced current is reduced and a matrix display is improved. In a TFT including a thin film semiconductor, having a source electrode, a drain electrode, a gate electrode, and corresponding source and drain regions, the channel region between the source and drain regions is protected from light by enlarging the source electrode and/or the drain electrode. These structures are described in detail, with reference to FIG. 4.

Figure 4:
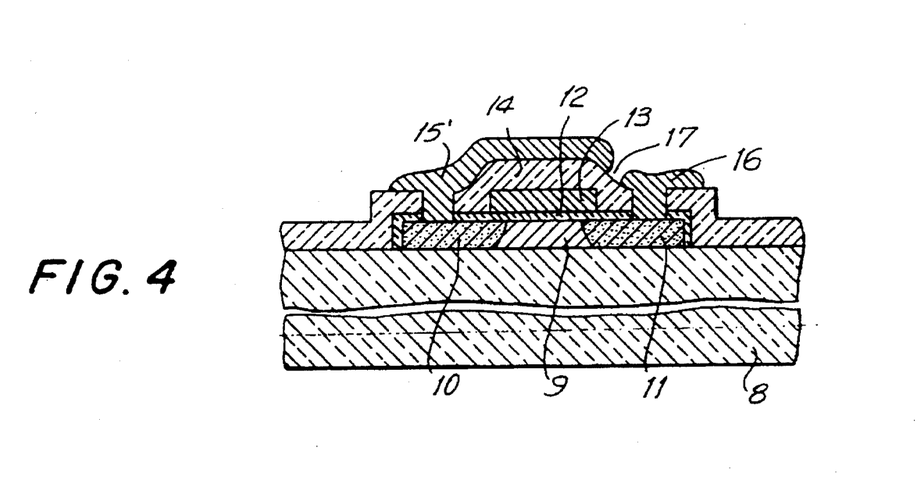
FIG. 4 is a sectional view of a thin film transistor of the invention including a patterned source electrode covering the channel region.

The reference numerals correspond to those of FIG. 2.

As shown in FIG. 4, channel region 9 between source region 10 and drain region 11 is completely shielded from light because it is covered by an extended source electrode 15'. Source electrode 15' is extended over insulating layer 14 to overlap channel 9 in plan view to block incident light from reaching channel 9. Source electrode 15 and drain electrode 16 are made of, e.g. aluminum. A space 17 occurs between electrodes 15' and 16 through which light radiates. The width of space 17 is determined by the limitation of the patterning technique, and should be as narrow as possible. Nevertheless, light introduced through space 17 generates carriers mainly in drain region 11. This has no influence upon and would not increase the photo-induced current, because the density of doped impurity is so high that the generated carriers can not exist for a long time and the mobility of the carriers is very poor. Accordingly, the structure as shown in FIG. 4 substantially reduces the generation of photo-induced current. The invention can also be practiced by covering channel region 9 with a prolonged drain electrode rather than source electrode 15'.

This construction in accordance with the invention is advantageous as either source region 10 or drain region 11 is simultaneously covered by an electrode which covers channel region 9 and light irradiates only the other region. Therefore, the photo-induced current is further reduced as compared to the case in which only the channel region is covered by a mask which interrupts the introduction of light.

Moreover, TFTs can be manufactured in accordance with the invention without any special processing techniques. For instance, they can be manufactured by conventional processes which only require changing the pattern for the source electrode or drain electrode.

Figure 5:
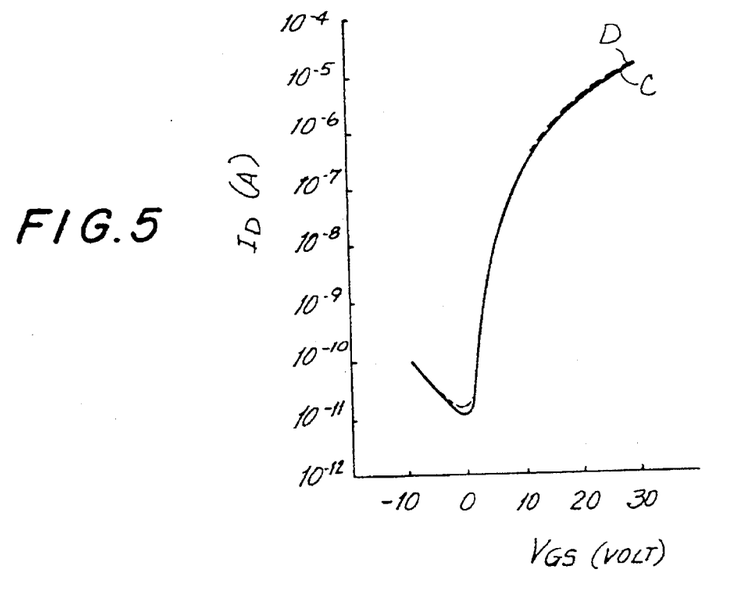
FIG. 5 is a graph illustrating the drain current and gate voltage of the transistor of FIG. 4 under a light and non-light condition.

FIG. 5 is a graph illustrating characteristics of a transistor of the type shown in FIG. 4 and is based on experimental results. The abscissa and ordinate parameters are the same as in FIG. 3. A solid line C shows drain current without light (i.e. dark current) and a broken line D shows drain current under light of 10,000 luxes. Line C corresponds to line A of FIG. 3. As shown in FIG. 5, the generated photo-induced current is very small. The amount of OFF current increases only about 1PA under an intensive light of 10,000 luxes. This small increment in OFF current is inevitably caused by a light-induced from the space between the source electrode and the drain electrode.

Figure 6:
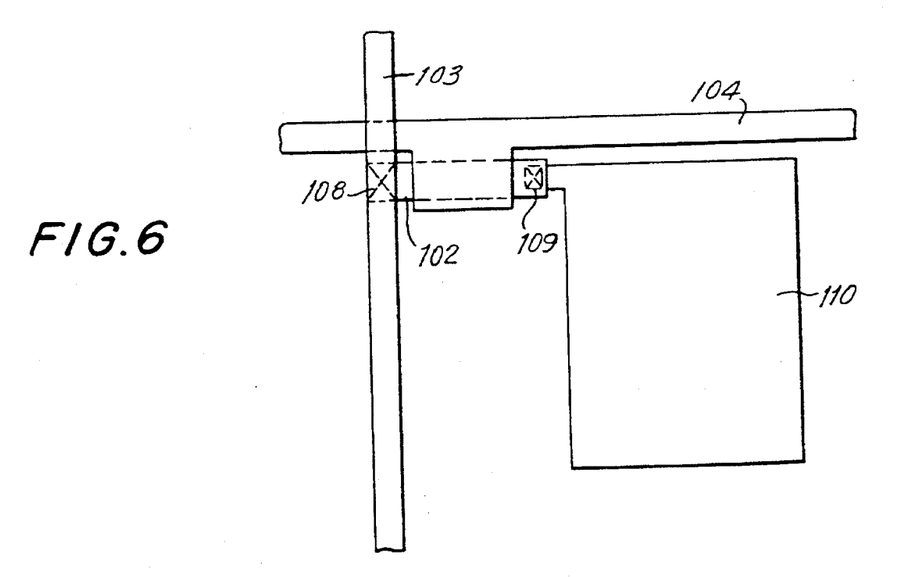
FIG. 6 is a plan view of one liquid crystal display element including a thin film transistor in an active matrix array.

FIG. 6 is an enlarged plan view of a liquid crystal display element including a TFT in an active matrix display panel of the type shown in FIG. 1a wherein the TFTs are formed on the lower substrate. Each display element includes a polycrystalline silicon layer 102. A timing signal line 104 is formed for each row of liquid crystal display elements 2 of FIG. 1 and is the scanning gate electrode portion. A data signal line 103 for each column of liquid crystal driving elements, is a signal electrode portion. Signal electrode 103 is brought into contact with polycrystalline silicon layer 102 at a contact portion 108. A display electrode 110 is connected to polycrystalline silicon layer 102 at a contact portion 109. In a transparent type liquid crystal display panel, display electrode 110 is transparent. Thus, transparent display electrode 110 should be connected to a drain electrode in polycrystalline silicon layer 102.

A conventional TFT connected to a transparent electrode is described with reference to FIG. 7. A thin film layer 202 made of polycrystalline silicon, amorphous silicon cadmium selenide or the like is formed on an insulating substrate 201. An insulating layer 203 is formed on layer 202. A gate electrode 204 is formed on insulating layer 203. A source region 205a and drain region 205b are formed by doping impurities into thin film layer 202. An insulating film 206 is formed across substrate 201. Metal layers 207a and 207b are formed in contact holes in insulating film 206 for interconnection to source and drain regions 205a and 205b.

Figure 7:
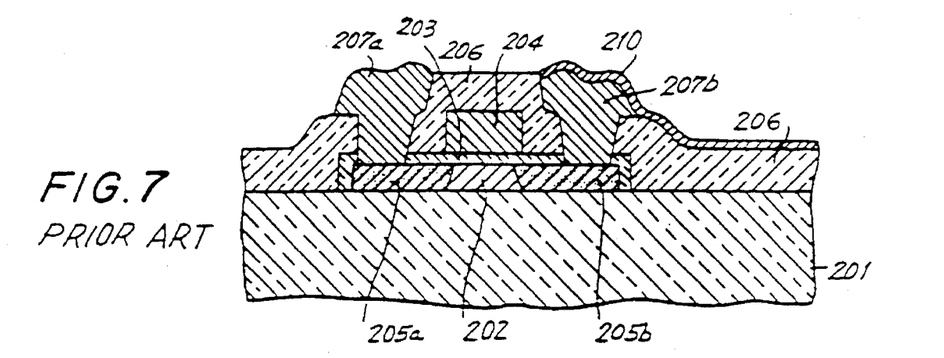
FIG. 7 is a sectional view of a thin film transistor illustrating the contact between the drain region and a transparent electrode of a display element.

The transistor of FIG. 7 has a three-layer electrode construction wherein metallic layer 207b interconnects drain region 205b and a transparent driving electrode 210, made of indium tin oxide or the like material. However, this conventional construction has disadvantageous contact characteristics. For example, if metallic layer 207b is made of aluminum, conductivity will decrease due to an aluminum oxide ($Al_2O_3$) layer formed between the aluminum and transparent electrode 210. As a result, variations in display contrast are caused by the insulation which reduces the conductivity between electrode 210 and metallic layer 207b. This variation adversely affects display characteristics.

In view of this, it is also a principal object of the invention to improve the construction of a transparent type liquid crystal display device wherein a transparent electrode is connected to a drain electrode formed in a polycrystalline silicon layer. Such an improved construction with stable and excellent contact characteristics is described, by way of illustration with reference to FIGS. 8 and 9.

Figure 8:
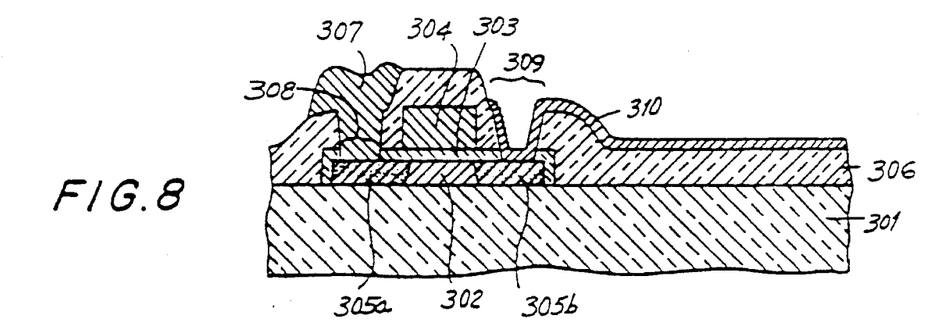
FIG. 8 is a sectional view of a thin film transistor illustrating the improved contact between the drain region and the transparent electrode in accordance with the embodiment of the invention.

In FIG. 8, a polycrystalline silicon layer 302 is formed on a transparent insulating substrate 301 and patterned to a pre-determined configuration. Then, a gate insulating layer 303 is formed on polycrystalline silicon layer 302 and a gate electrode 304 is manufactured thereon. N-type impurities are doped into poly-crystalline silicon layer 302 by ion implantation utilizing gate electrode 304 as a mask to form diffused regions which serve as a source region 305a and a drain region 305b of the transistor. After an insulating layer 306 is formed thereon, contact holes 308 and 309 are formed in source region 305a and drain region 305b, respectively, by photo-etching. Then, a transparent electrode 310 made of indium tin oxide or the like is formed and patterned as the driving electrode.

At this time transparent electrode 310 is brought into contact directly with drain region 305. A signal electrode layer 307 made of aluminum or the like material is then formed for inter-connection with source region 305a. Thus, direct contact between drain region 305b and transparent electrode 310 provides stable and favorable contact characteristics. An additional advantage is that a large contact hole can be provided and the size of driving electrode 310 can be increased because opaque metal such as aluminum is not present at contact hole 309 on the side of drain region 305b. Consequently, stable and excellent contact characteristics can be provided as a result of the direct contact between the drain region in a polycrystalline silicon layer and the transparent driving electrode.

Figure 9:
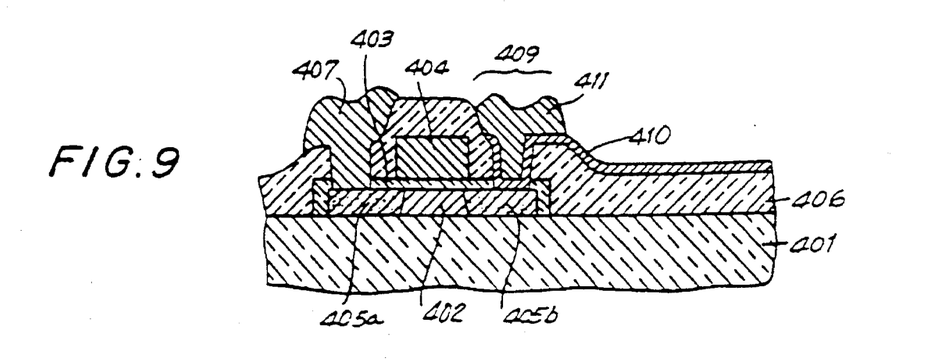
FIG. 9 is a sectional view of an alternate embodiment of FIG. 8, illustrating an additional contact with the transparent electrode.

FIG. 9 shows another embodiment of this invention with like reference numerals as used in FIG. 8, (e.g. 307–407) and is manufactured in the same manner as the transistor of FIG. 8. In the last step of manufacture of the electrode layers, a metallic layer 411, for interconnection of aluminum and the like, is provided to cover contact hole 409 between drain region 405b and transparent electrode 410. In accordance with this embodiment, even if the coverage of transparent driving electrode 410 is poor at contact hole 409, conductivity to driving electrode 410 is never cut off because of metallic layer 411 in contact hole 409 which serves as a conductor. Thus, in a transparent type liquid crystal display device utilizing transistors of the type illustrated in FIGS. 8 and 9, display contrast can be free from variations caused by poor contact characteristics between the drain region and the driving electrode.

Accordingly, this embodiment of the invention also provides an improved TFT for a transparent type liquid crystal display device having stable, improved contact characteristics between a drain electrode and a transparent electrode. In the embodiments of FIGS. 8 and 9 described herein, which are presented by way of example only, an N-type polycrystalline silicon layer on the substrate has been utilized. However, this invention can be applied to other cases, such as a P-type polycrystalline layer. Additionally, in the embodiments described herein, contact between a drain region and a transparent electrode has been described. It is contemplated within the invention that a source region can also be in contact with a transparent electrode.

When a matrix array including thin film transistors is formed on a transparent insulating substrate, such as a glass substrate, it is very difficult to provide a circuit to prevent static electricity from affecting the matrix. As a result, the production yield of usable matrix arrays is reduced substantially because of poor insulation between crossing conductive elements.

Figure 10A:
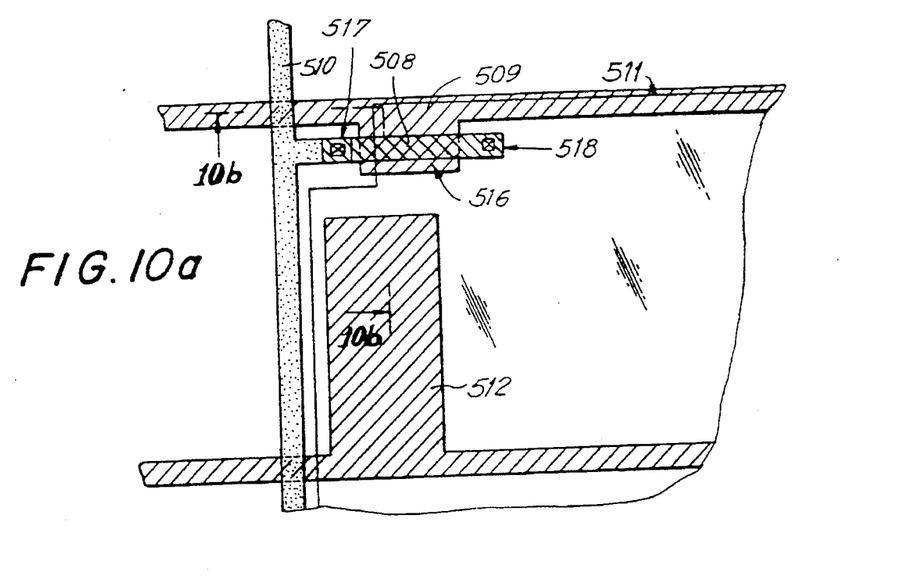
Figure 10B:
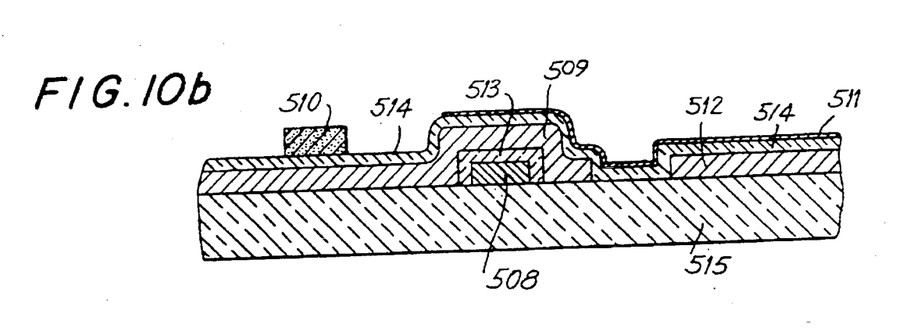

FIG. 10a is a detailed plan view of a picture element in a display device of the type illustrated in FIG. 1a. FIG. 10b is a sectional view of the picture element of FIG. 10a taken along line 10b. The picture elements include a polycrystalline silicon layer 508 formed on a glass substrate 515 with a gate insulating layer 513 formed by oxidizing the surface of poly-crystalline layer 508. A second layer of polycrystalline silicon is formed and photo-etched to form a pattern thereon, thereby simultaneously forming a gate line and gate electrode 509 of a transistor 516, and one electrode of a capacitor 512. Impurities are then diffused into the region of first polycrystalline silicon layer 508, except where covered with gate electrode 509, in order to form a source region 517 and a drain region 518 of transistor 516. Subsequently, an insulating layer 514 is formed over the entire surface and contact holes are formed in the region of source region 517 and drain region 518. A source line 510 and a picture element driving electrode 511 are then formed on insulating layer 514.

In transistor 516, insulating layer 514, which insulates source line 510 from gate line 509, is disposed between driving electrodes 511 and capacitor electrode 512 of the capacitor which holds the data signal. As the capacitance of a capacitor is in inverse proportion to the thickness of its insulating layer, insulating layer 514 should be relatively thin to provide high capacitance in the capacitor. For example, in a case where one picture element is a square of 1 millimeter in size, the area of a capacitor is limited to 200 $um^2$, so as not to affect the brightness of the display. If an insulating layer formed of silicon oxide has a thickness of 5,000 angstroms, the capacitance of the capacitor is only about 2.5 picofarad. In contrast, the capacitance of a liquid crystal in a picture element must be about 9 picofarad when the thickness of the liquid crystal is 10 microns.

The capacitance of the capacitor in a display element should be at least one, and preferably two to three times, as great as that of the liquid crystal. To obtain this condition, the thickness of the insulating layer should be one-fifth to one-tenth of the liquid crystal, or the area of the capacitor should be five times to ten times as great as that of the liquid crystal. As the area of the capacitor is limited to maintain minimum brightness of the display panel, a reduction in thickness of the insulating layer is the only way to make the capacitance of a capacitor larger than that of the liquid crystal material. Consequently, in this case, the silicon oxide layer should be about 1,000 angstroms in thickness. Even when utilizing silicon nitride having a greater dielectric constant, the thickness of the insulating layer should be limited to 1000 to 2000 angstroms.

Gate insulating layer 513 of transistor 516 usually has a thickness of at least about 1,000 to 2,000 angstroms. When the breakdown voltage of a transistor is high, the insulating layer 514 is required to have a thickness of 5,000 angstroms or more. In comparing the breakdown voltage between insulating layer 514 and gate insulating layer 513, the breakdown voltage of gate insulating layer 513 is twice as high as that of insulating layer 514, when both layers are the same thickness. This result is due to the fact that insulating layer 513 comprises thermally formed silicon oxide while insulating layer 514 is a layer of silicon oxide deposited by chemical vapor deposition. Thus, when the thickness of gate insulating layer 513 and insulating layer 514 are between 1,000 and 2,000 angstroms, the breakdown voltage of insulating layer 514 is necessarily lower than that of gate insulating layer 513. As a result, static electricity inevitably damages a gate line or a source line at the region where the gate line and source line intersect.

Increasing the thickness of insulating layer 514, in order to ward off the damage at the intersection of a gate line and source line, causes the capacitance of the capacitor to decrease to less than that of the liquid crystal material. In an effort to avoid this, in another embodiment in accordance with this invention, the breakdown voltage of an insulating layer is higher at the intersection between a gate line and source line than in the capacitor, thereby preventing line fault damage caused by static electricity, while maintaining sufficiently high capacitance of the capacitor.

Figure 11A:
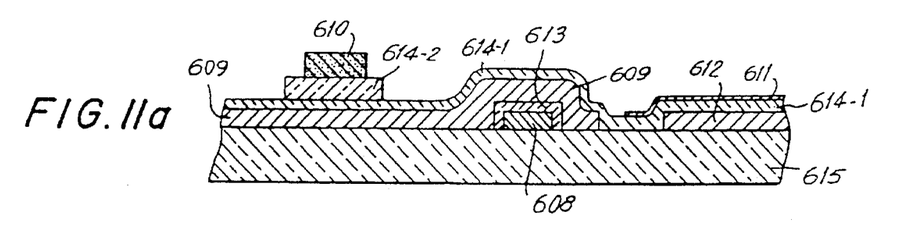
FIG. 11a is a sectional view of the same portion of a display element as in FIG. 1b, illustrating the improved insulation between the source line and gate line in accordance with the invention.

FIG. 11*a* is a sectional view of a display picture element on a glass substrate 615, in accordance with this embodiment of the invention.

Figure 11B:
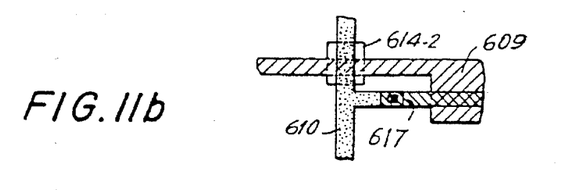

FIG. 11*b* is a plan view showing an intersecting portion between a gate line 609 and a source line 610 of an element in the matrix display. Corresponding elements to the element of the embodiment illustrated in FIGS. 10*a* and FIGS. 10*b* are designated by the same last digits in their reference numerals.

In addition to the processing steps followed for forming the insulating layer 614-1 described with respect to insulating layer 514 in FIG. 10*b* a second silicon oxide layer 614-2 is formed all over the surface of substrate 615. Then second silicon oxide layer 614-2 is removed by photo-etching, except in a region where gate lines 609 and source lines 610 intersect as shown in FIG. 11*b*. Subsequently, contact holes are provided in the area of the source region and drain region of first silicon oxide layer 614-1. Lastly source lines 610 are formed.

The thickness of first silicon oxide layer 614-1 is 1,000 angstrom or less, which should provide sufficient capacitance in the capacitor. On the other hand, the thickness of second oxide layer 614-2 is 5,000 angstrom or more in order to raise the breakdown voltage at the intersect between gate line 609 and source line 610. Thus, the construction according to this embodiment is advantageous in that the breakdown voltage at an intersection between a gate line and a source line is higher than at the gate of gate insulator of the transistor while maintaining the capacitance of the capacitor sufficiently large. Second silicon oxide layers 614-2 may be formed first and photo-etched before "first" silicon oxide layer 614-1 is formed.

When the first and second insulating layers are formed of the same material, such as silicon oxide, the thicker insulating layer which insulates gate line 609 from source line 610 is much more easily photo-etched than thinner insulation layer 614-1. Further, when insulating layer 614-1 is formed first and second insulating layer 614-2 is then formed thereon, it is preferable to form the two layers of different materials, for example, a first layer of silicon nitride and a second layer of silicon oxide, because either of these layer may be alternatively photo-etched at the time of patterning.

Figure 12A:
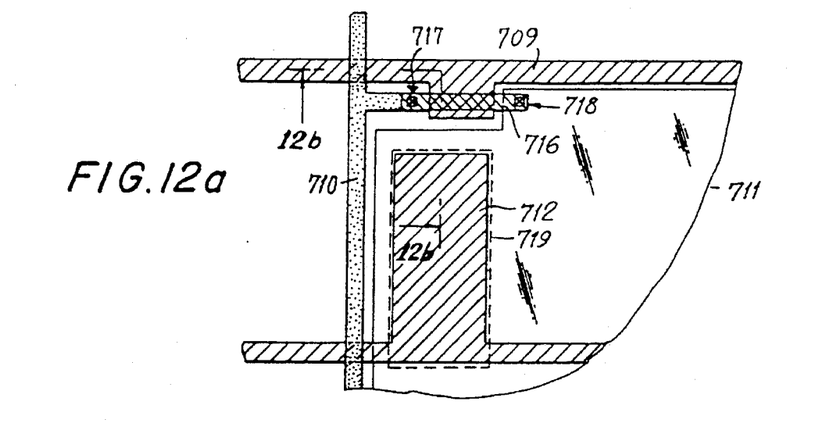
Figure 12B:
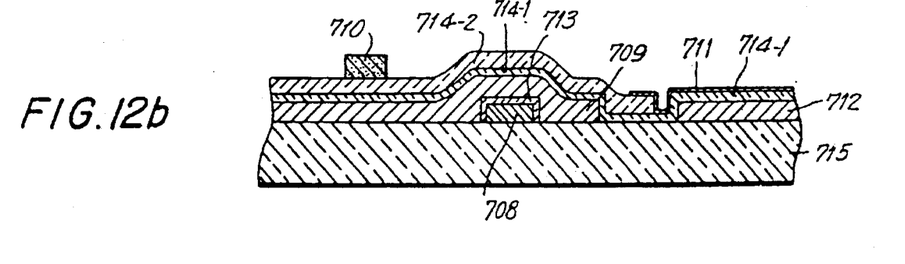

FIGS. 12*a* and 12*b* illustrates another embodiment in accordance with this aspect of the invention. FIG. 12*a* is a plan view of a picture element of a display device of the type illustrated in FIG. 1*a* and FIG. 12*b* is a sectional view taken along line 12*b* of FIG. 12*a*. As in the display element illustrated in FIG. 11 like elements are identified by the last two digits of the reference numerals. A thermal oxide layer 713 is formed on the surface of a thin silicon layer 708 and a second thin silicon layer 709 and 712 is formed and patterned. Impurities are diffused into first silicon layer 708, except in the region of 708 covered by silicon layer 709 to form a source region 717 and a drain region 718. After forming first insulating layer 714-1 and second insulating layer 714-2 subsequently, a portion of second insulating layer 714-2 in the region of capacitor electrode 712 is removed by photo-etching, resulting in only first insulating layer 714-1 on silicon layer 712. Silicon layer 712 is one electrode of the capacitor for the picture element. Subsequently, contact holes are formed in insulating layer 714-1 and 714-2 at source region 717 and drain region 718 of transistor 716. Source line 710 and picture element driving electrode 711 are then formed.

In this embodiment, when the thickness of first insulating layer 714-1 is about 1,000 angstrom and that of second insulating layer 714-2 is about 5,000 angstroms or more, the breakdown voltage at the intersection between a source line and a gate line will be higher that at a gate of the transistor. Furthermore, the capacitor for picture element has sufficient capacitance. In addition, according to the embodiment of FIGS. 12*a* and 12*b*, the picture element can also be protected by thick insulating layer 714-2, which results in improved reliability. As indicated by broken line 719 about capacitor electrode 712 in FIG. 12*a* the opening in the thick insulating layer 714-2 may substantially conform to or cover around the edge of the capacitor. However, the larger the area of etching off insulating layer 714-2, the greater the capacitance of the capacitor that can be formed. Insulating layers 714-1 and 714-2 are usually formed of silicon oxide. Alternatively, can be formed of silicon nitride or aluminum oxide. In addition, the order of forming the insulating layers can be reversed, similar to the embodiment of FIGS. 11*a* and 11*b*.

Further, the display area of driving electrode 711 can be increased to cover gate line 709 and a part of transistor 716. Therefore, the quality of image brightness is much improved. It is preferred to cover gate line 709 and a part of transistor 716 with a picture element driving electrode 711 in a construction as in FIG. 12, because thick insulating layer 714-2 contributes to diminution of faults, such as shorts.

As described above, according to this invention, the breakdown voltage at an intersection between a source line and a gate line can be higher than that of a gate insulator of a transistor by forming an insulating layer thicker in the region where the source line and the gate line intersect than at other regions. The damage to a matrix array caused by static electricity can be limited to involve only a picture element fault, not a line fault. Accordingly, production yields of matrix arrays are improved, permitting economic mass production. In addition, capacitance of the capacitor is increased to provide an improved matrix array with respect to the charging characteristics of a data signal. As a result, a display characteristic of a display device utilizing such a matrix array is improved.

In the embodiments described herein, a matrix array wherein the capacitor electrode is independently provided, has been described, but the invention is intended to be applicable to a matrix array wherein one electrode of the capacitor and the gate line of the adjacent picture element thereof are in common. Thus, improved thin film transistors and active matrix liquid crystal display panels utilizing the transistors as switching elements having reduced photo-induced current, improved electrode contact and increased resistance to static electricity are provided.

It will thus be seen that the objects set forth above, among those made apparent from the preceding description, are efficiently attained and, since certain changes may be made in carrying out the above process, in the described product, and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of forming a liquid crystal device having an array of picture elements arranged in a matrix, each of the picture elements having a thin film transistor as a switching element for driving each of the picture elements, a picture element driving electrode connected to said thin film transistor and a display capacitor, the method comprising:

forming a plurality of gate lines and a first electrode of each of the display capacitors, the plurality of gate lines being connected to gate electrodes of the thin film transistors on a substrate;

forming a first non-conductive film over the plurality of gate lines and the first electrode of each of the display capacitors;

forming a second non-conductive film over said first non-conductive film and over the first electrode of each of the display capacitors;

removing the second non-conductive film formed over the first electrode of each of the display capacitors;

forming a plurality of source lines connected to source electrodes of the thin film transistors and crossing the plurality of gate lines; and forming a second electrode of each of the display capacitors over the first electrode of each of the display capacitors and over said first non-conductive film to form the display capacitors, wherein the first and second non-conductive films are overlapped at crossing portions of the source and gate lines.

2. The method of claim 1, wherein the second non-conductive film has a thickness of 6,000 Å or more for increasing a breakdown voltage at the intersections of the gate lines and the source lines.

3. The method of claim 1, wherein said first electrode of each of the display capacitors is formed by a portion of one of the gate lines.

4. A method of forming a liquid crystal device having an array of picture elements arranged in a matrix, each of the picture elements having a thin film transistor as a switching element for driving each of the picture elements, a picture element driving electrode connected to said thin film transistor and a display capacitor, the method comprising:

forming a plurality of gate lines and a first electrode of each of the display capacitors, the plurality of gate lines being connected to gate electrodes of the thin film transistors on a substrate;

forming a first non-conductive film over the plurality of gate lines and the first electrode of each of the display capacitors;

removing the first non-conductive film formed over the first electrode of each of the display capacitors;

forming a second non-conductive film over the first non-conductive film and the first electrode of each of the display capacitors;

forming a plurality of source lines connected to source electrodes on the thin film transistors and crossing the plurality of gate lines; and forming a second electrode of each of the display capacitors over the first electrode of each of the display capacitors and over the first non-conductive film to form the display capacitors, wherein the first and second non-conductive films are overlapped at crossing portions of the source and gate lines.

5. The method of claim 4, wherein the second non-conductive film has a thickness of 6,000 Å or more for increasing a breakdown voltage at the intersections of the gate lines and the source lines.

6. The method of claim 4, wherein the first electrode of each of the display capacitors is formed by a portion of one of the gate lines.

* * * * *